US009465056B2

(12) United States Patent
Han et al.

(10) Patent No.: US 9,465,056 B2
(45) Date of Patent: Oct. 11, 2016

(54) CURRENT SENSOR WITH TEMPERATURE-COMPENSATED MAGNETIC TUNNEL JUNCTION BRIDGE

(71) Applicant: Multidimension Technology Co., Ltd., Zhangjiagang (CN)

(72) Inventors: Liansheng Han, Zhangjiagang (CN); Jianmin Bai, Zhangjiagang (CN); Wei Li, Zhangjiagang (CN); Songsheng Xue, Zhangjiagang (CN)

(73) Assignee: MultiDimension Technology Co., Ltd., Zhangjiagang Jiangsu (CN)

( * ) Notice: Subject to any disclaimer, the term of this patent is extended or adjusted under 35 U.S.C. 154(b) by 134 days.

(21) Appl. No.: 14/368,299

(22) PCT Filed: Oct. 30, 2012

(86) PCT No.: PCT/CN2012/083742
§ 371 (c)(1),
(2) Date: Jun. 24, 2014

(87) PCT Pub. No.: WO2013/097542
PCT Pub. Date: Jul. 4, 2013

(65) Prior Publication Data
US 2014/0327437 A1 Nov. 6, 2014

(30) Foreign Application Priority Data
Dec. 30, 2011 (CN) .......................... 2011 1 0452834

(51) Int. Cl.
*G01R 19/00* (2006.01)
*G01R 19/32* (2006.01)
(Continued)

(52) U.S. Cl.
CPC ......... *G01R 19/0092* (2013.01); *G01R 15/205* (2013.01); *G01R 17/10* (2013.01); *G01R 19/32* (2013.01); *G01R 33/06* (2013.01); *G01R 33/098* (2013.01)

(58) Field of Classification Search
None
See application file for complete search history.

(56) References Cited

U.S. PATENT DOCUMENTS

| 5,055,781 A * | 10/1991 | Sakakibara | G01B 7/30 257/E43.004 |
| 2010/0026289 A1 * | 2/2010 | Taylor | G01R 33/093 324/252 |
| 2013/0066587 A1 * | 3/2013 | Kalathil | G01D 5/06 702/150 |

FOREIGN PATENT DOCUMENTS

| CN | 200959021 Y | 10/2007 |
| CN | 101788596 A | 7/2010 |

(Continued)

OTHER PUBLICATIONS

Machine Translation of CN101788596 to Wang et al.*

(Continued)

*Primary Examiner* — Jermele M Hollington
*Assistant Examiner* — Douglas X Rodriguez
(74) *Attorney, Agent, or Firm* — Schwegman Lundberg & Woessner, P.A.

(57) ABSTRACT

A current sensor comprises a sensor bridge, with magnetic tunnel junction (MTJ) elements, a MTJ temperature compensation resistor, and a current lead integrated onto a chip. The current lead is positioned close to the sensor bridge, and it is used to carry the test current. A permanent magnet is arranged at the periphery of the MTJ temperature compensation resistor. The permanent magnet rigidly aligns the magnetization direction of the free layer of the MTJ temperature compensation resistor anti-parallel to the magnetization direction of a pinning layer. The sensor bridge is connected in series with the MTJ temperature compensation resistor to temperature compensate the sensor bridge. A magnetic field generated by the test current produces an output voltage at the output of the temperature compensated sensor bridge that is proportional to the test current value.

8 Claims, 14 Drawing Sheets

(51) Int. Cl.
  *G01R 15/20* (2006.01)
  *G01R 17/10* (2006.01)
  *G01R 33/06* (2006.01)
  *G01R 33/09* (2006.01)

(56) References Cited

FOREIGN PATENT DOCUMENTS

| CN | 201622299 U | 11/2010 |
| CN | 102419393 A | 4/2012 |
| CN | 202421321 U | 9/2012 |
| JP | 09-043327 A | 2/1997 |
| JP | 2008-122083 A | 5/2008 |
| WO | WO-2013/097542 A1 | 7/2013 |

OTHER PUBLICATIONS

"International Application Serial No. PCT/CN2012/083742, International Preliminary Report on Patentability dated Jul. 1, 2014", (w/ English Translation), 14 pgs.

"International Application Serial No. PCT/CN2012/083742, International Search Report mailed Feb. 7, 2013", (w/ English Translation), 6 pgs.

"International Application Serial No. PCT/CN2012/083742, Written Opinion mailed Feb. 7, 2013", (w/ English Translation), 12 pgs.

Huang, Xinping, et al,, "Thin-film magneto resistive element and magneto-resistive current sensor", (w/ English Abstract), *Sensor World*, No. 1, (Jan. 1999), 39-41.

\* cited by examiner

CURRENT SENSOR WITH TEMPERATURE-COMPENSATED MAGNETIC TUNNEL JUNCTION BRIDGE

CROSS-REFERENCE TO A RELATED APPLICATION

This application is a 35 U.S.C. §371 national phase application of PCT/CN2012/083742, filed on Oct. 30, 2012, which claims priority to a Chinese Patent Application No. 201110452834, filed on Dec. 30, 2011, incorporated herein by reference in its entirety.

FIELD OF THE TECHNOLOGY

The present invention relates to a current sensor, in particular a magnetic tunnel junction current sensor utilizing a magnetic tunnel junction resistor for temperature compensation.

BACKGROUND ART

The Hall Effect is commonly used in the sensing element of current sensors. Additionally but less commonly, the anisotropic magnetoresistance (AMR) and the giant magnetoresistance (GMR) effects are also used in the sensing elements of current sensors. What these effects have in common is they can be used to build a magnetic sensor in order to measure the magnetic field generated by a current flowing through a conductor, which is proportional to the value of the current flowing through the conductor.

Because the sensitivity of Hall elements is very low, when Hall elements are used in current sensors, a magnetic flux concentrator is usually used to amplify the magnetic field, in order to increase the sensitivity of the Hall sensor. Unfortunately this increases the size and weight of the current sensor, and it degrades linearity. Additionally, Hall sensors have high power consumption, which is undesirable. Although AMR sensors have much higher sensitivity than Hall sensors, AMR sensors have narrower linear range, and they require a set/reset coil, resulting in manufacturing process complexity, increased size, and increased power consumption. GMR sensors also have higher sensitivity than Hall sensors, but the linear range is also narrow.

Magnetic tunnel junctions (MTJ) are beginning to find application as magnetoresistive sensors for industrial applications. They use the tunneling magnetoresistance (TMR) effect of a multilayered magnetic material stack to sense the magnitude and direction of a magnetic field, with significantly larger sensitivity than AMR, Hall, and GMR sensors, while also providing better temperature stability. Thus a current sensor utilizing MTJ sensing elements provides improved temperature stability, higher sensitivity, lower power consumption, and better linearity than a Hall effect based current sensor with no additional magnetic flux concentrator structure; compared to AMR current sensors it provides improved temperature stability, higher sensitivity, wider linear range without additional set/reset coil structure; and, compared to GMR based current sensors, it provides better temperature stability, higher sensitivity, lower power consumption, and wider linear range.

Although temperature characteristics of a TMR based current sensor are superior to Hall Effect, AMR, and GMR based current sensors, temperature compensation is still necessary for high accuracy.

SUMMARY OF THE INVENTION

The present invention provides a current sensor using MTJ elements both to sense the magnetic field from the current and to compensate temperature drift thereby providing high sensitivity, wide linear range, low power consumption, small size, and good temperature performance characteristics.

To achieve the above object, the present invention provides a single chip current sensor comprising a MTJ sensor bridge containing one or more MTJ elements, an electric conductor in the vicinity of the sensor bridge that carries a test electric current, and at least one MTJ temperature compensation resistors, wherein magnets are placed on the sides of the one or more MTJ temperature compensation resistors producing a magnetic field to bias the free layer of the MTJ elements in the temperature compensation resistors such that the direction of the magnetization of the free layer of each of the MTJ temperature compensation elements is anti parallel to the direction of the magnetization of its pinned layer, such that the one or more MTJ temperature compensation resistors are in a high resistance state that only changes as the function of temperature in the measurement range of the current sensor, wherein the sensor bridge is connected in series with the one or more MTJ temperature compensation resistors so as to stabilize the sensor bridge voltage output, and the sensor bridge determines the test electric current by measuring the magnetic field produced by the test electric current in the electric conductor which is provided as an output voltage.

Preferably, the MTJ sensor bridge and the one or more MTJ temperature compensation resistors respectively comprise one or more MTJ elements connected in series, wherein said MTJ elements have the same temperature coefficient, $R_H$, and $R_L$.

Preferably, the sensor bridge is a half bridge.

Preferably, the sensor bridge is a full bridge.

The present invention uses the above structure to compensate for temperature drift of the current sensor while providing the benefits of high sensitivity, wide linear range, low power consumption, small size, and excellent thermal stability.

SPECIFIC EMBODIMENTS

Figure 1:
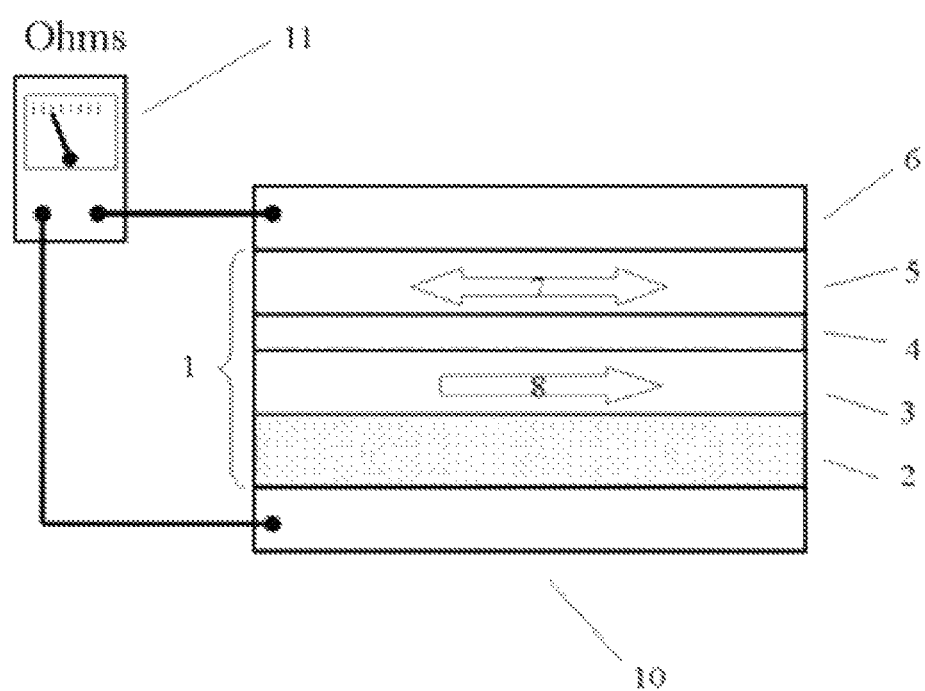
FIG. 1 is a diagram of a magnetic tunnel junction element.

FIG. 1 schematically illustrates the multilayer film and operational concept of an MTJ element. An MTJ element 1 generally includes a synthetic antiferromagnet (SAF) 3, and another ferromagnetic layer or 5, between on opposing sides of a tunnel barrier layer 4. In this structure, the upper layer is the free layer whose magnetization direction is changed in response to the external magnetic field. The lower ferromagnetic layer (SAF layer) 3 is a fixed magnetic layer, and its magnetization direction is rigidly pinned in one direction, so that under normal conditions, it will not change. The pinning layer 2 is usually an antiferromagnetic material that can be deposited above or below a pinned layer SAF. The MTJ structure is usually deposited on top of a conductive seed layer 10 for use as the bottom electrode, while another conductive capping layer 6 is deposited on top of the MTJ structure. The resistance 11 of the MTJ element is measured between the seed layer 10 and the capping layer 6, and it represents the relative orientation of the free layer 5 and the pinned layer 3 magnetization directions. When the upper ferromagnetic free layer 5 and the lower the lower ferromagnetic pinning layer magnetization directions are parallel to each other, the resistance 11 of the MTJ element will be representative of the low resistance state. When the upper ferromagnetic free layer 5 lower ferromagnetic pinned layer 3 magnetization directions are antiparallel to each other, the overall resistance of the element 11 will be representative of the high resistance state. By known techniques, MTJ element 1, can be fabricated such that the change in resistance between the low and high resistance states is linearly dependent on magnetic field.

Figure 2:
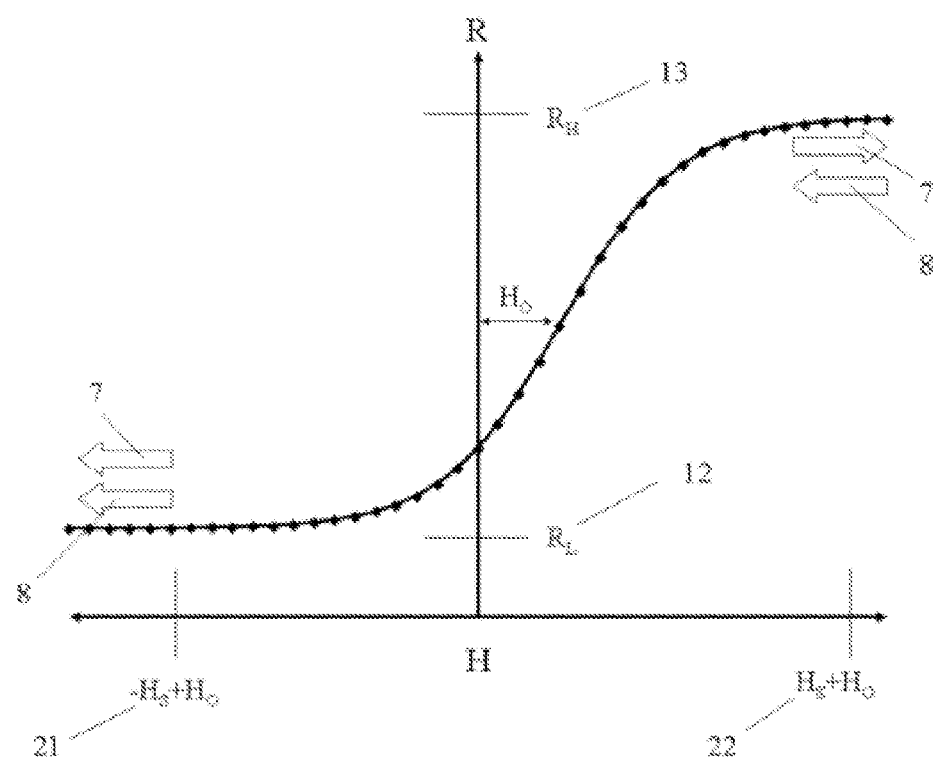
FIG. 2 shows a plot of the transfer curve of a MTJ linear magnetic field sensing element with magnetic field applied along the hard axis direction.

FIG. 2 shows the linear response of a MTJ magnetoresistive element 1. When saturated, the output curve will be in either the low resistance 12 or high resistance 13 states. When the magnetization direction of the pinned layer 8 is parallel to the magnetization direction of the free layer 7, the MTJ element 1 is a low-resistance state 12; when the magnetization direction of the pinned layer 8 is anti-parallel to the magnetization direction of the free layer 7, the MTJ element 1 is a high-resistance state 13. Before saturation is reached, the output curve is linearly dependent on the applied magnetic field H. The output curve is usually not symmetric about H=0. Typically the saturation fields 21 and 22 are offset with respect to H=0, such that the low-resistance state 12 saturation point is closer to H=0. The offset value is often referred to as "orange peel coupling" or "Neel coupling," the typical value of this offset is usually between 1 and 25 Oe, and the roughness of the MTJ element 1, the influence the effect, making it dependent on materials and manufacturing processes. Between the saturated regions, the output curve equation can be approximated as:

$$R(H) = \frac{R_H - R_L}{2H_s}(H - H_o) + \frac{R_H + R_L}{2} \quad (1)$$

Figure 3:
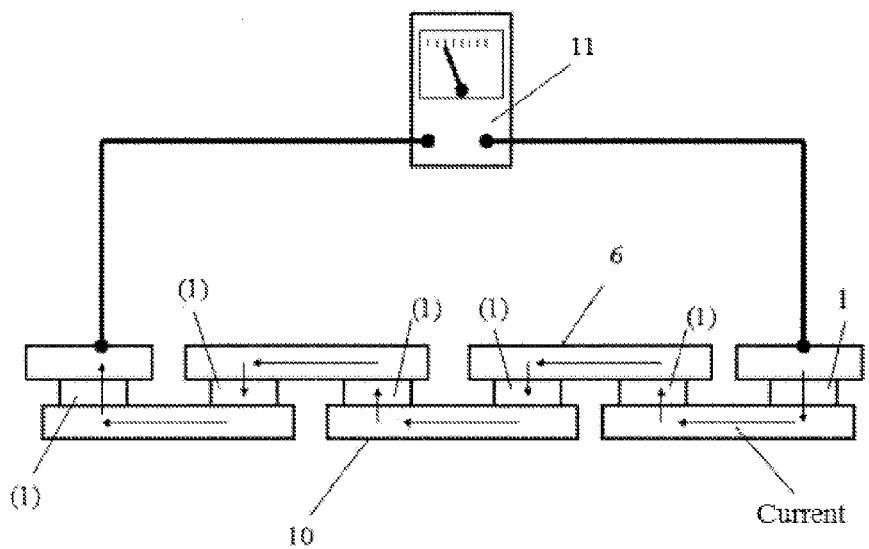
FIG. 3 shows how several MTJ elements can be connected in series to form a magnetoresistor.

FIG. 3 shows several MTJ elements 1 is connected in series to form a MTJ magnetoresistor. This series connected MTJ magnetoresistance structure helps to reduce noise and improve stability of the sensor. In the MTJ magnetoresistor, the bias voltage of each of the MTJ element 1, decreases as the number of magnetic tunnel junctions increases. This reduces the current required to produce a large output voltage, thus reducing shot noise, along with the increasing ESD immunity. In addition, as the number of MTJ elements 1 is increased, the noise of the MTJ is correspondingly reduced, because the uncorrelated random variation of each MTJ element 1 averages out.

Figure 4:
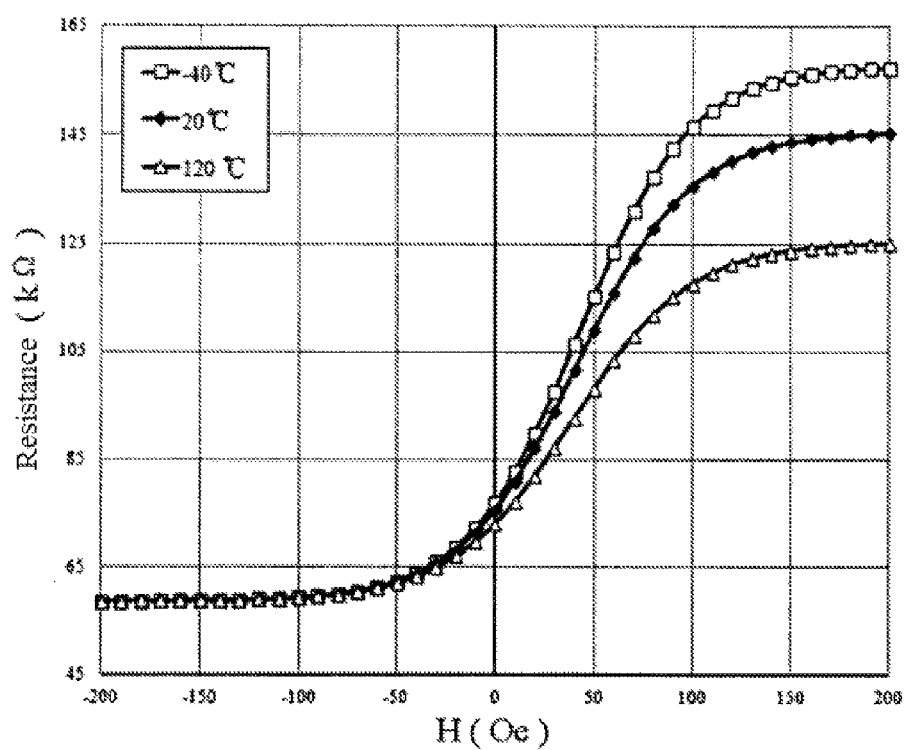
FIG. 4 shows the magnetoresistive transfer curve of an MTJ element at different temperatures.

FIG. 4 shows MTJ output curves acquired at various different temperatures, it shows that as the temperature rises, the MTJ element low resistance does not change significantly, but the high resistance value changes significantly, such that overall, MTJ magnetoresistance decreases with increasing temperature.

Figure 5:
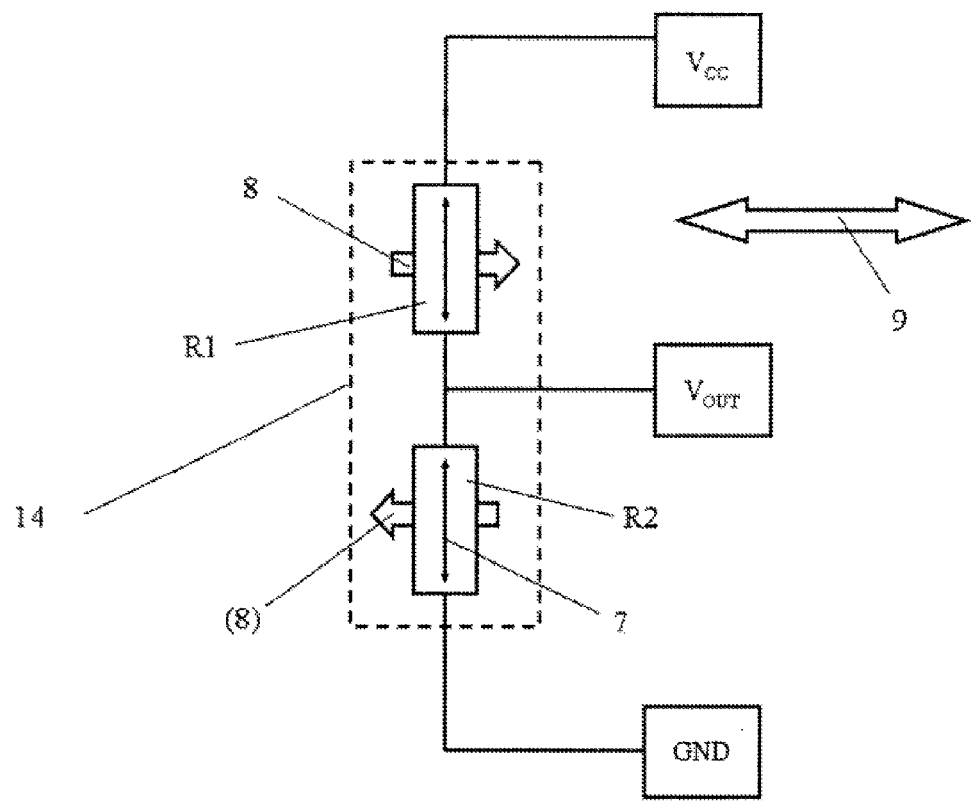
FIG. 5 is a schematic diagram of a push-pull half-bridge MTJ sensor.
Figure 6:
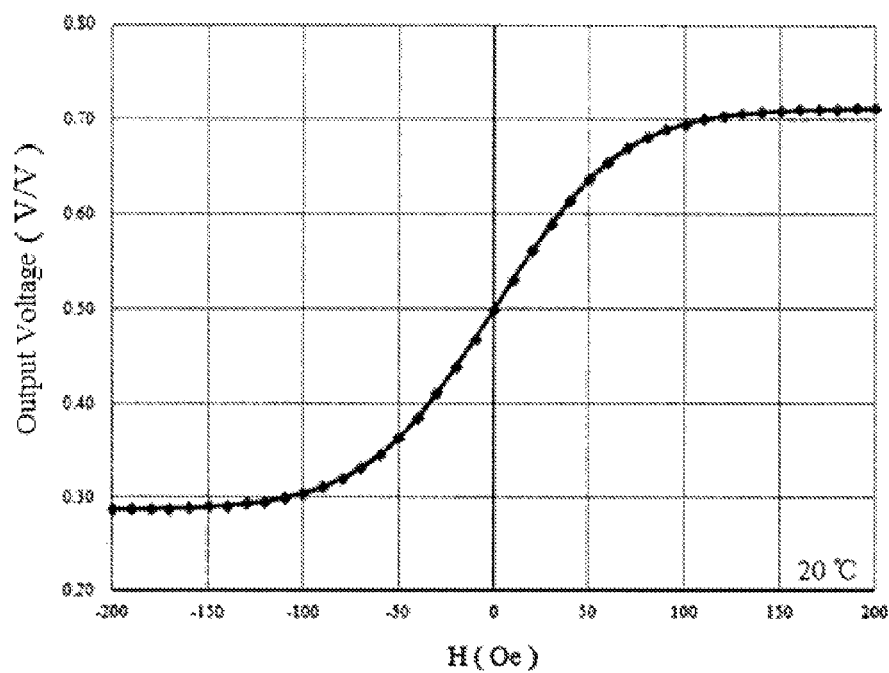
FIG. 6 shows the typical output of a push-pull half-bridge MTJ sensor.

FIG. 5 is a schematic diagram of a push-pull half-bridge MTJ sensor. As shown, the two MTJ resistors R1, R2 have anti-parallel pinned layer magnetization directions, and the magnetization direction of the free layer 7 changes in response to the external magnetic field, a steady voltage, Vbias, is applied between the Vcc and GND terminal pads, and the Vout pad is the bridge output. When applying an external magnetic field to the push-pull half-bridge sensor, the magnetic field component along the sensitive direction 9 increases the resistance of resistor R1 while decreasing the resistance of resistor R2, when applied in the opposite direction the magnetic field decreases the resistance of resistor R1 while increasing the resistance of resistor R2. The typical push-pull half-bridge sensor output curve is shown in FIG. 6.

Figure 7:
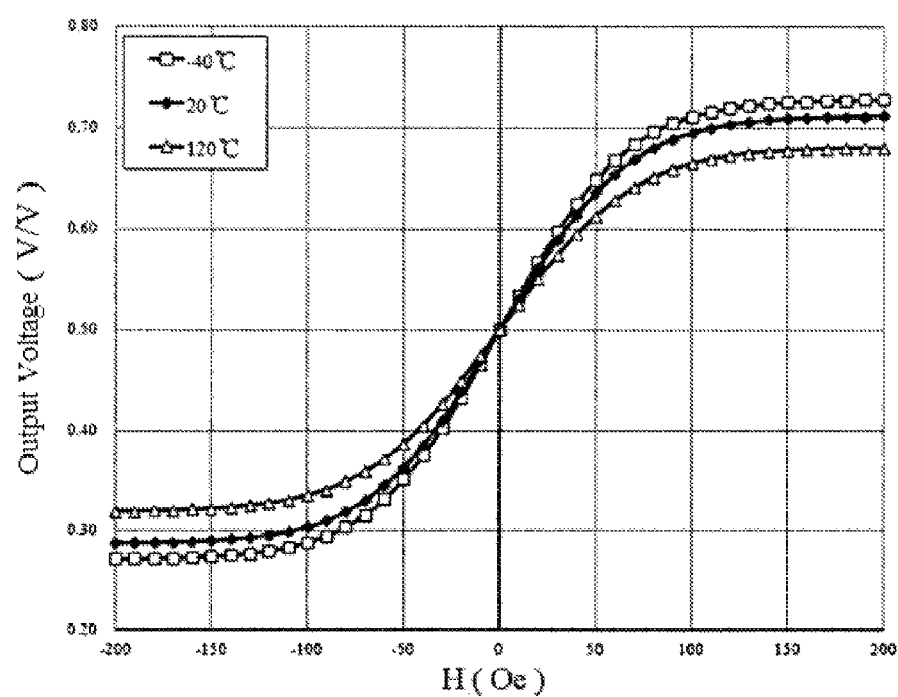
FIG. 7 shows the simulated output of a push-pull half-bridge MTJ sensor at different temperatures.

FIG. 7 shows the simulated output of a push-pull half-bridge MTJ sensor at different temperatures. As shown, the output voltage of the half-bridge circuit is reduced as the temperature rises.

Figure 8:
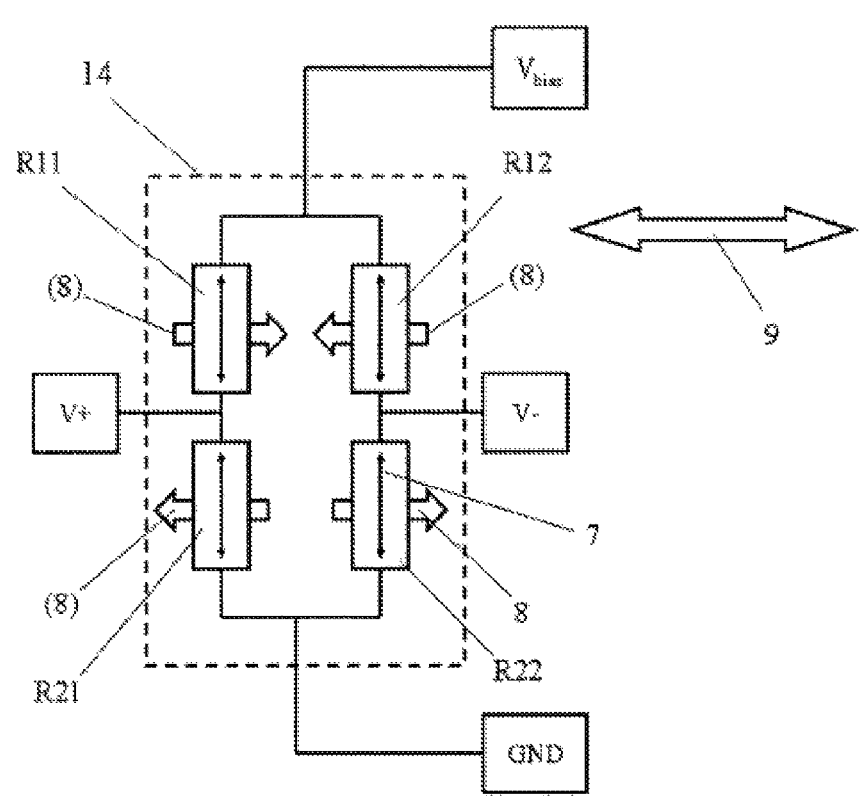
FIG. 8 is a schematic diagram of a push-pull full-bridge MTJ sensor.

FIG. 8 schematically illustrates a push-pull full-bridge MTJ sensor. As shown n the figure four MTJ resistors R11, R12, R21, R22 are connected in a full bridge configuration, a steady bias voltage is applied between the Vbias and GND terminal pads, the pads V+ and V− are the output terminals, the magnetization direction of the free layer 7 of the four resistors changes in response to an externally applied magnetic field, resistors R11 and R22 (R12 and R21) have a pinned layer magnetization 8 pointing in the same direction, the adjacent resistors R11 and R12 (R11 and R21, etc.) have their pinned layer magnetizations 8 pointing in opposite directions, the sensitive direction 9 of the bridge circuit is along the axis parallel and antiparallel to the pinned layer direction 8.

When applying a magnetic field to the full-bridge push-pull, the component of the magnetic field along the sensitive direction 9 increases the resistance of resistors R11 and R22 while decreasing the resistance of the other two resistors R12 and R21, when the polarity of the applied magnetic field is changed the resistance of R11 and R22 is decreased while the resistance of R12 and R21 increases accordingly, using two pairs of resistors with the opposite response—one pair of resistors has increasing response while another has decreasing response—can increase the sensitivity of the bridge circuit output. This arrangement is called a "push-pull" full-bridge circuit. The output voltage of each half is defined:

$$V1(H) = \frac{R21(H)}{R11(H) + R21(H)} V_{bias} \quad (2)$$

-continued $$V2(H) = \frac{R22(H)}{R12(H) + R22(H)} V_{bias} \quad (3)$$

The combined bridge output is defined as:

$$V(H) = V1(H) - V2(H) \quad (4)$$

In the bridge circuit, the MTJ resistance values may be defined as:

$$R_{11}(H) = R22(H) = \frac{R_H - R_L}{2H_s}(-H - H_o) + \frac{R_H + R_L}{2} \quad (5)$$

$$R12(H) = R21(H) = \frac{R_H - R_L}{2H_s}(H - H_o) + \frac{R_H + R_L}{2} \quad (6)$$

Such that:

$$V(H) = \left(\frac{R_H - R_L}{R_H + R_L}\right)\left(\frac{H}{H_s}\right) V_{bias} \quad (7)$$

Figure 9:
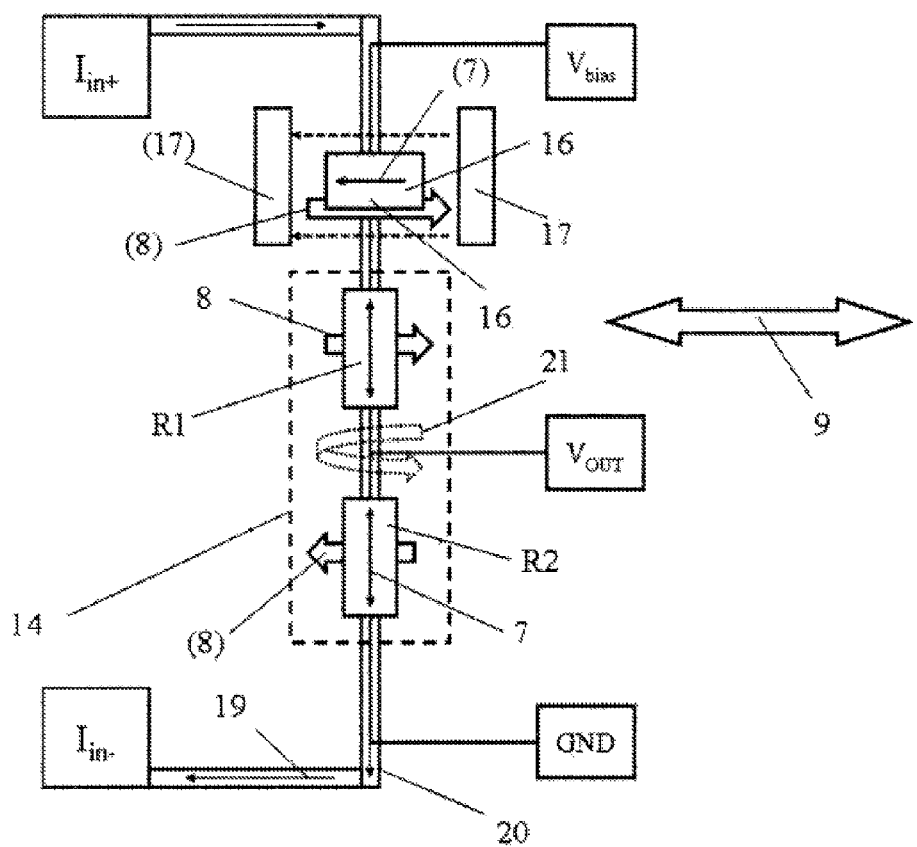
FIG. 9 shows the typical output of a push-pull full-bridge MTJ sensor.

This is the output of the push-pull full-bridge, and a simulated output curve is shown in FIG. 9.

Figure 10:
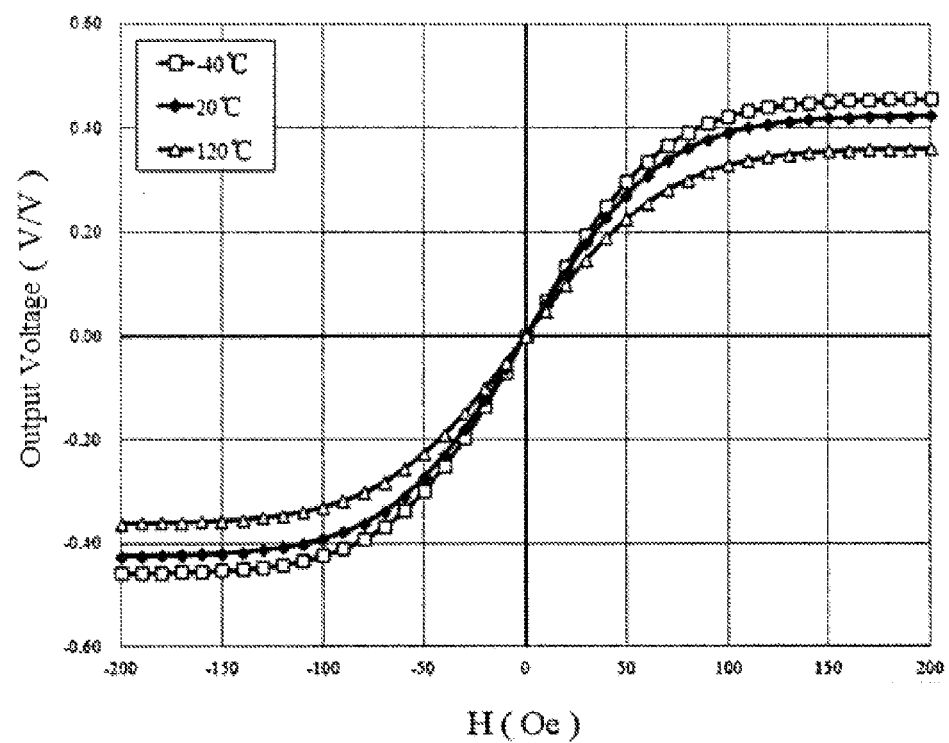
FIG. 10 shows the simulated output of a push-pull full-bridge MTJ sensor at different temperatures.

FIG. 10 shows a simulation of the MTJ push-pull full-bridge circuit output at different temperatures. It clearly indicates that as the temperature increases, the output voltage of the bridge circuit is reduced.

Figure 11:
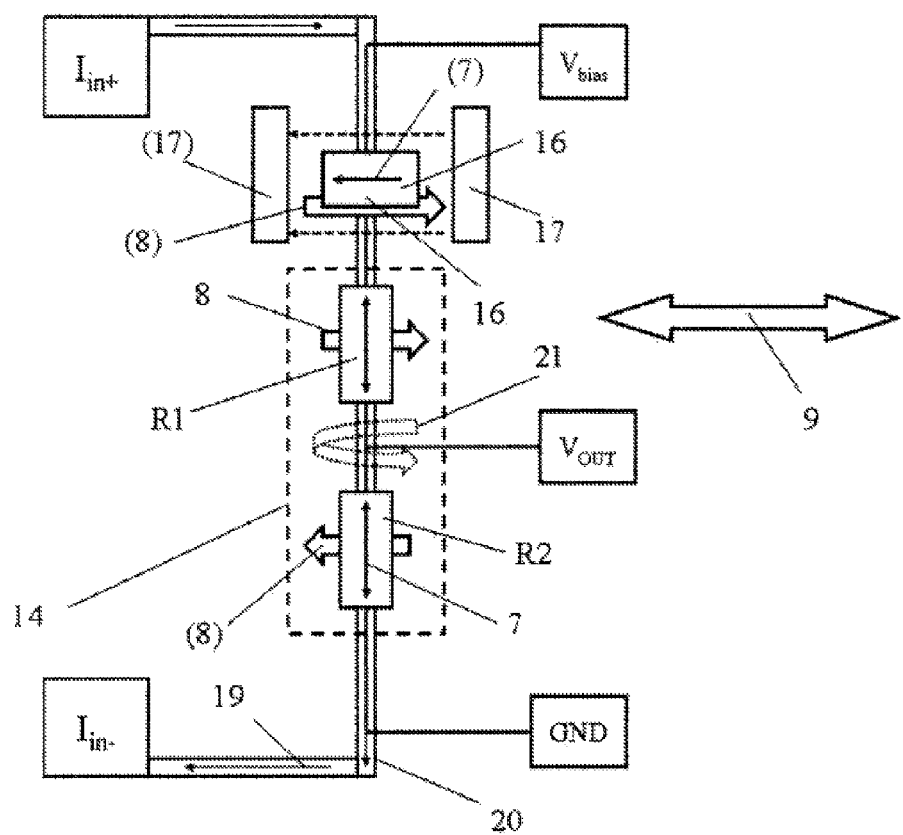
FIG. 11 illustrates the concept of temperature compensation resistors applied to a half-bridge TMR current sensor.

It is not difficult to see, the MTJ bridge output drifts with temperature because the MTJ elements resistance changes leading to a change in output voltage. To compensate the temperature drift, a temperature compensating resistor can be used. FIG. 11 schematically illustrates a temperature compensation resistor 16 on a chip connected with a MTJ half-bridge circuit. As shown, the half-bridge circuit 14 is connected in series with the temperature compensation resistor 16. Temperature compensation resistor 16 is biased by the magnetic field of permanent magnet 17 setting the magnetization direction of the free layer 7, so that it is antiparallel to the magnetization direction of the pinned layer 8 and therefore in the high resistance state 13, and the external field does not change the resistance 11 within the measurement temperature range. The chip is provided with a conductor 20 in which the measured current 19 flows between the $I_{in+}$ and $I_{in-}$ pads, the sensor bridge circuit 14 detects the magnetic field 21 produced by the current 19. Ideally temperature compensation resistor 16 has the same temperature coefficient as half-bridge arm resistors R1, R2 such that the effect of temperature cancels out, when the magnetoresistance changes with temperature, the temperature compensation resistor and the bridge circuit move higher and lower respectively at the same time, such that the output of the bridge is stable against temperature, providing the temperature compensation.

Figure 12:
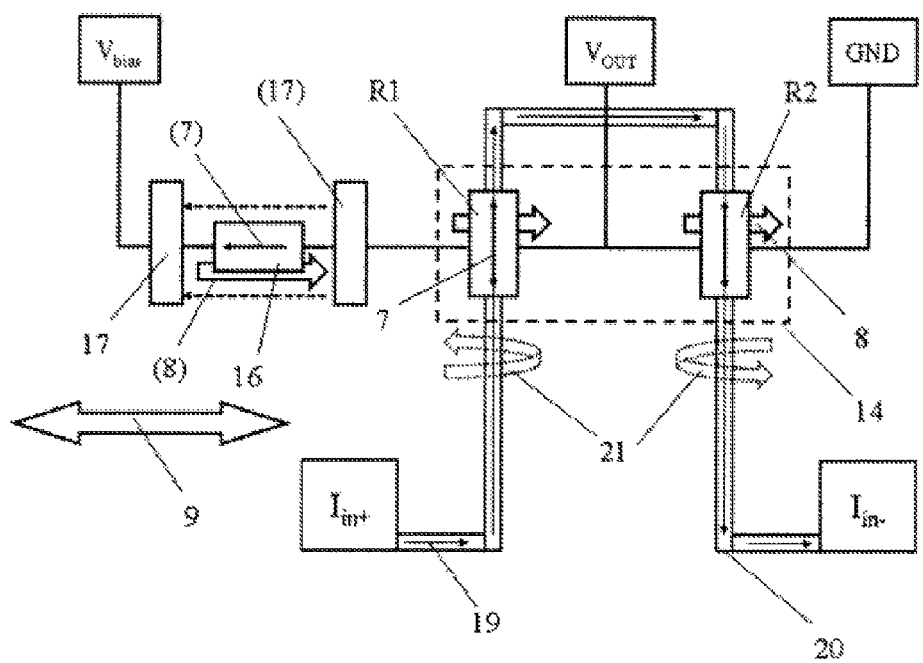
FIG. 12 shows another arrangement for implementing a temperature compensation resistor within a half-bridge MTJ current sensor.

FIG. 12 shows another single-chip MTJ half-bridge plus temperature compensation resistor 16 arrangement. As shown in the figure, the bridge resistors R1 and R2, have pinned layer magnetization 8 pointing in the same direction, while the magnetization direction of the free layer 7 varies in response to the external field, half bridge circuit 14 and the temperature compensation resistor 16 are connected in series, temperature compensation resistor 16 is biased with a strong permanent magnet 17 to set the magnetization direction of the free layer 7, antiparallel to the magnetization direction of the pinned layer 8 such that the resistance is in the high resistance state 13, and the external field does not change the resistance 11 within the measurement temperature range. The chip is provided with a U-shaped conductor 20 above or below resistors R1 and R2 in which the measured current 19 flows between the $I_{in+}$ and $I_{in-}$ pads, the sensor bridge circuit 14 detects the magnetic field 21 produced by the current 19.

Figure 13:
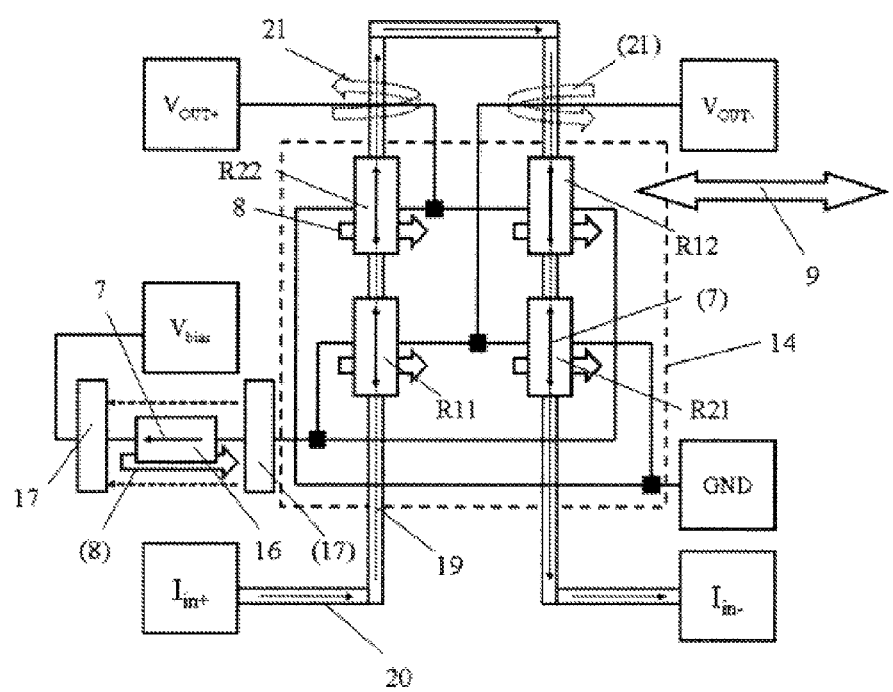
FIG. 13 illustrates a concept for using a temperature compensation resistor within a full-bridge MTJ current sensor.

FIG. 13 shows another single-chip MTJ full-bridge plus temperature compensation resistor 16 arrangement. As shown, the four MTJ resistors R11, R12, R21, and R22 are interconnected as full-bridge and connected in series with temperature compensation resistor 16, the four MTJ resistors have magnetization direction 8 of the pinned layer rigidly aligned in the same direction and the free layers 7 change in response to the external magnetic field, compensation resistor 16 is biased with a strong permanent magnet 17 to set the magnetization direction of the free layer 7, antiparallel to the magnetization direction of the pinned layer 8 such that the resistance is in the high resistance state 13, and the external field does not change the resistance 11 within the measurement temperature range. The chip is provided with a U-shaped conductor 20 in which the measured current 19 flows between the $I_{in+}$ and $I_{in-}$ pads, the sensor bridge circuit 14 detects the magnetic field 21 produced by the current 19.

The output of the bridge circuit Vout(T) and the actual output voltage Vout of the bridge are linearly related by the following function:

$$V_{OUT}(T) 32\ V_{OUT}(1 + k_T \Delta T) \quad (8)$$

Figure 14:
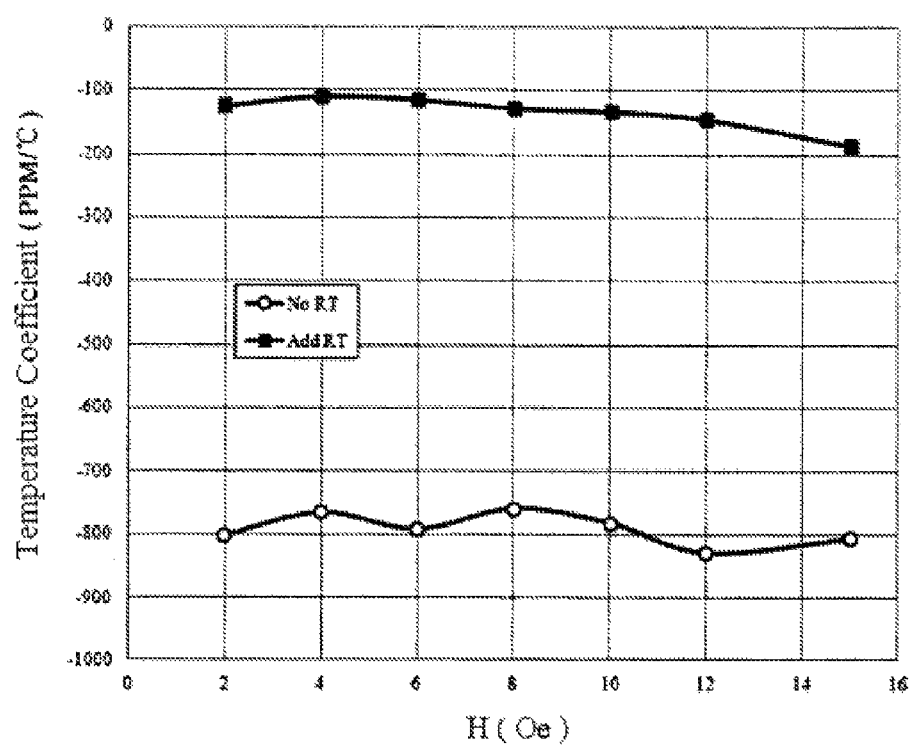
FIG. 14 shows a plot of two different curves for the temperature dependence of the output of temperature compensated and uncompensated MTJ current sensors.

The "kT" is the temperature coefficient of the bridge, where in Hall current sensors kT is commonly expressed in terms of PPM/C. FIG. 14 shows testing results for the temperature coefficient of a MTJ push-pull full-bridge with and without a temperature compensating resistor, we can clearly see, before removing the temperature compensating resistor, the temperature coefficient is much smaller, therefore the effect of the temperature compensating resistor is obvious.

While specific implementations of the present invention are illustrated, obviously, various modifications of the invention may be made without departing from the spirit or scope of the invention. Those skilled in the art of the present invention understand that the spirit and intent of the present invention is not changed by such modifications.

The invention claimed is:

1. A single chip current sensor comprising a magnetic tunnel junction (MTJ) sensor bridge containing one or more MTJ resistors, an electric conductor in the vicinity of the sensor bridge that carries a test electric current, and at least one MTJ temperature compensation resistor, wherein two magnets are placed on opposing sides of the one or more MTJ temperature compensation resistors producing a magnetic field to bias the free layer of the MTJ elements in the one or more temperature compensation resistors such that the direction of the magnetization of the free layer of each of the MTJ elements in the temperature compensation resistors is anti-parallel to the direction of the magnetization of its pinned layer, such that the one or more MTJ temperature compensation resistors are in a high resistance state that only changes as the function of temperature in the measurement range of the current sensor, wherein the sensor bridge is connected in series with the one or more MTJ temperature compensation resistors so as to stabilize the sensor bridge voltage output, and the sensor bridge determines the test electric current by measuring the magnetic field produced by the test electric current in the electric conductor which is then provided as an output voltage.

2. The single chip current sensor of claim 1, wherein the MTJ resistors and the one or more MTJ temperature compensation resistors respectively comprise one or more MTJ elements connected in series, wherein said MTJ elements have the same temperature coefficient, high resistance ($R_H$), and low resistance ($R_L$).

3. The single chip current sensor of claim 1, wherein the sensor bridge is a half bridge.

4. The single chip current sensor of claim 1, wherein the sensor bridge is a full bridge.

5. A current sensor, comprising a single chip, the single chip including:
  a magnetic tunnel junction (MTJ) sensor bridge, the MTJ sensor bridge including at least two MTJ resistors;
  a current conductor, wherein the current conductor and the MTJ sensor bridge are operably positioned to allow the MTJ sensor bridge to sense a magnetic field produced by current flowing on the current conductor; and
  at least one MTJ temperature compensation resistor connected in series with the MTJ sensor bridge, each MTJ temperature compensation resistor including a free layer and a pinned layer, two magnets on opposing sides of each MTJ temperature compensation resistor, the magnets to produce a magnetic field to bias magnetization of the free layer in a direction that is antiparallel to the direction of the magnetization of the pinned layer.

6. The current sensor of claim 5, wherein the sensor bridge is a half bridge.

7. The current sensor of claim 5, wherein the sensor bridge is a full bridge.

8. The current sensor of claim 5, where each of the at least two MTJ resistors and the at least one MTJ temperature compensation resistor have the same temperature coefficient, high resistance ($R_H$), and low resistance ($R_L$).

* * * * *